United States Patent [19]

Imura et al.

[11] Patent Number: 4,701,385
[45] Date of Patent: Oct. 20, 1987

[54] ION-IMPLANTED MAGNETIC BUBBLE DEVICE AND A METHOD OF MANUFACTURING THE SAME

[75] Inventors: Ryo Imura, Tokorozawa; Tadashi Ikeda, Kanagawa; Yutaka Sugita, Tokorozawa, all of Japan

[73] Assignee: Hitachi, Ltd., Tokyo, Japan

[21] Appl. No.: 680,891

[22] Filed: Dec. 12, 1984

[30] Foreign Application Priority Data

Dec. 14, 1983 [JP] Japan ................................ 58-234244

[51] Int. Cl.⁴ ............................................... B32B 9/00
[52] U.S. Cl. ....................................... 428/693; 427/38; 427/127; 427/130; 428/900
[58] Field of Search .......................... 427/38, 127–132, 427/48; 428/693

[56] References Cited

U.S. PATENT DOCUMENTS 4,556,582 12/1985 Imura et al. ........................... 427/38
4,568,561 2/1986 Betsui et al. .......................... 427/38

*Primary Examiner*—Bernard D. Pianalto
*Attorney, Agent, or Firm*—Antonelli, Terry & Wands

[57] ABSTRACT

In a magnetic bubble device, a strain layer formed on the surface of a magnetic bubble garnet film by ion-implantation is required to have anisotropy field of great strength in the in-plane direction for driving magnetic bubbles. For preventing the effective anisotropy field change from being decreased by heat treatment, ion species having large mass and projected standard deviation not greater than 1000 Å are implanted. The ion species are preferably selected from He to Kr in the periodic table. The heat treatment is effected at a temperature in a range of 450° C. to 900° C.

12 Claims, 9 Drawing Figures

ANGLE OF DIFFRACTION 2θ

ANGLE OF DIFFRACTION 2θ

ION-IMPLANTED MAGNETIC BUBBLE DEVICE AND A METHOD OF MANUFACTURING THE SAME

BACKGROUND OF THE INVENTION

The present invention relates generally to a magnetic bubble memory device provided with ion-implanted propagation tracks. More particularly, the invention is concerned with a magnetic bubble memory device having an ion-implanted strain layer of a uniform strain distribution and a method of manufacturing the magnetic bubble memory device.

The ion-implanted magnetic bubble memory device is characteristically provided with bubble propagation tracks formed by ion-implantation in a magnetic bubble garnet film destined to hold magnetic bubbles, as is disclosed in U.S. Pat. No. 3,828,329. The magnetic bubble memory device having the ion-implanted propagation tracks is suited to be realized with a high density because the propagation track has no gap. More specifically, referring to FIGS. 1a and 1b of the accompanying drawings, the aforementioned propagation track can be realized by forming a mask layer 6 of a photoresist or metal film on a surface of a magnetic garnet film 4 for holding magnetic bubbles 2 and then forming an in-plane magnetization layer 8 by implantation of ions such as hydrogen (H) ions, neon (Ne) ions or the like under the effect of magnetostriction strain brought about in the magnetic garnet film by the implantation of ions. The bubble propagation track extends along the edge 10 of the region on which the mask layer 6 is formed and which has thus undergone no ion-implantation. Upon application of a magnetic field in the in-plane direction, a magnetically charged wall makes appearance along the edge 10, resulting in that the magnetic bubbles 2 are propagated under attraction exerted by the magnetically charged wall.

For driving the magnetic bubbles, the ion-implanted strain layer 8 is firstly required to exhibit above all an implantation-induced anisotropy field of great magnitude in the in-plane direction. To this end, the strain layer has heretofore been formed by implantation of hydrogen ions which can assure that the effective anisotropy field change is substantially in proportion to magnitude of the strain. With the phrase "effective anisotropy field change", it is intended to mean a change in the anisotropy field of the bubble film which is induced due to the ion implantation and constitutes a source of bubble driving force, wherein the change can be expressed by $\Delta(H_k - 4\pi M_s)$ where $H_k$ represents magnitude of the anisotropy field and $M_s$ represents density of saturation magnetization. However, it is observed that the effective anisotropy field change of the strain layer formed by the implantation of hydrogen ions is caused to decrease significantly by heat treatment required for stabilization of the characteristics of the bubble device, as will be seen in FIG. 2. Under the circumstance, formation of the strain layer by the implantation of hydrogen ions has heretofore been carried out by implanting hydrogen ions in excess in anticipation for the decrease in the effective anisotropy field change by the heat treatment. However, this method is disadvantageous in that an increased number of uncertain or unstable factors are involved in the manufacturing of the bubble devices which are thus unsuited for the manufacturing on the mass-production basis.

In order that the ion-implanted strain layer serves effectively as the magnetic bubble driving layer, it is necessary that distribution of the strain is flat and uniform. In this connection, it is noted that the strain distribution resulting from the single ion-implantation is similar to the Gaussian distribution 12, as shown in FIG. 3. Accordingly, for flattening the strain distribution, heat treatment is subsequently conducted, whereby the strain distribution brought about, for example, by the implantation of hydrogen ions, as described above, is transformed to a smoothed distribution profile 14 by mitigating the most remarkable strain. Such being the circumstance, multiple ion-implantations such as illustrated in FIG. 4 have heretofore been adopted in an effort to realize the uniform strain layer. According to this multiple ion-implantation method, the implantation of hydrogen ions which assures the effective anisotropy field change of great magnitude is combined with the strain distribution realized by implantation, for example, of Ne-ions, whereby a uniform strain distribution is obtained, as indicated by a curve 16. Although this method can assure uniform strain distribution, it is still disadvantageous in that distribution of the magnetic characteristic of the strain layer is non-uniform and that generation of different types or species of ions as well as a number of ion implanting processes is required because combination of the different species of ions is prerequisite.

SUMMARY OF THE INVENTION

An object of the present invention is to provide an ion-implanted magnetic bubble device of an improved structure which is evaded from the drawbacks of the prior art devices mentioned above and in which the strain distribution in the ion-implanted layer can be instantaneously flattened, the magnetic bubble device being thus manufactured with an improved reproducibility on a mass-production basis.

In view of the above object, there is provided according to an aspect of the invention an ion-implanted magnetic bubble device including an in-plane magnetization layer which is formed by implanting ions of projected standard deviation not greater than 1000 Å in a magnetic garnet film at desired locations of the surface region thereof and effecting subsequently a heat treatment at a high temperature.

BRIEF DESCRIPTION OF THE DRAWINGS

FIGS. 1a and 1b are views showing schematically an arrangement of ion-implanted bubble propagation tracks of a magnetic bubble device, wherein FIG. 1a is a plan view and FIG. 1b is a sectional view.

DESCRIPTION OF THE PREFERRED EMBODIMENTS

Now, the invention will be described in detail in conjunction with the preferred embodiments thereof.

Figure 1A:
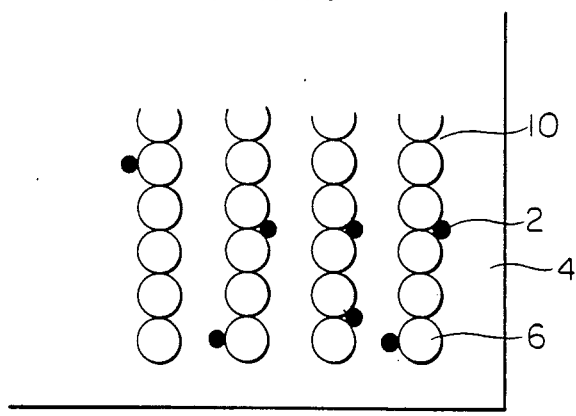
Figure 1B:
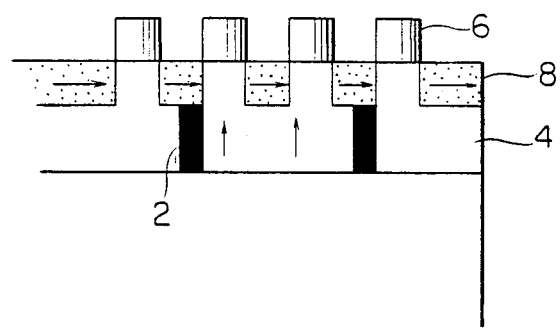
Figure 2:
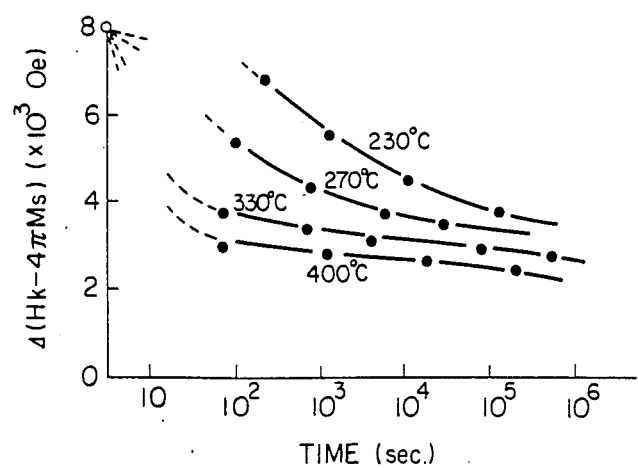
FIG. 2 is a view for illustrating graphically the effect of heat treatment to the effective anisotropy field change of a strain layer formed by implantation of H-ions.
Figure 3:
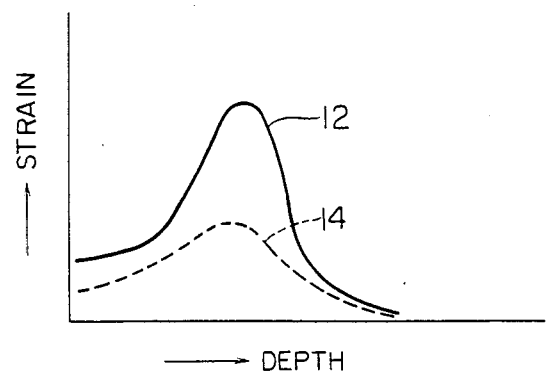
FIG. 3 is a view for illustrating graphically a strain distribution in the ion-implanted layer after the heat treatment.
Figure 4:
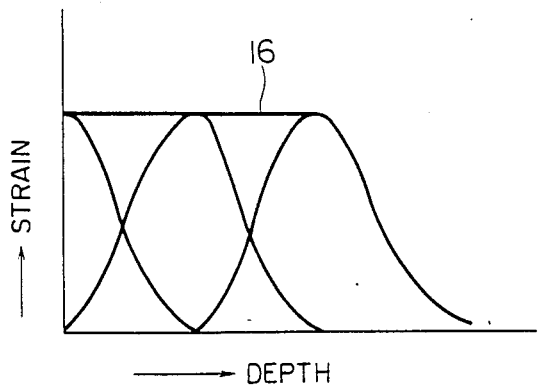
FIG. 4 is a view for illustrating graphically a strain distribution which has been flattened through combination of multiple ion-implantations.
Figure 5A:
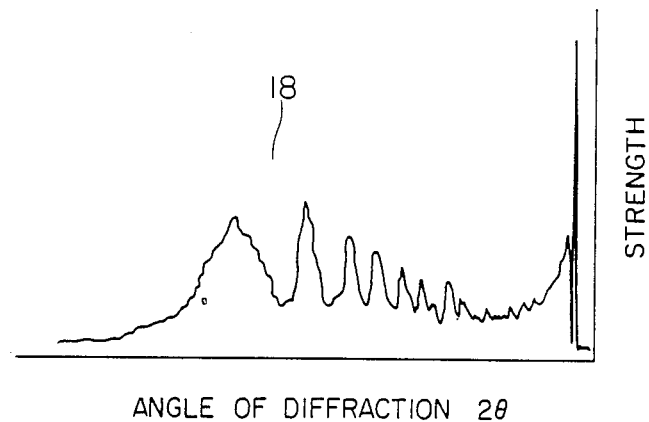
FIGS. 5a and 5b are views showing X-ray diffraction curves of ion-implanted strain layers for illustrating the concept of the present invention.
Figure 5B:
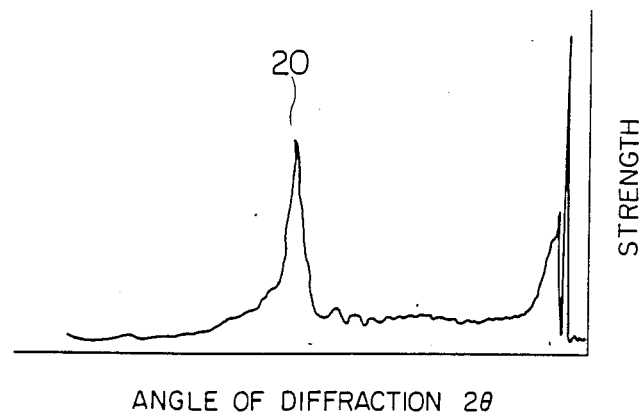
Figure 6:
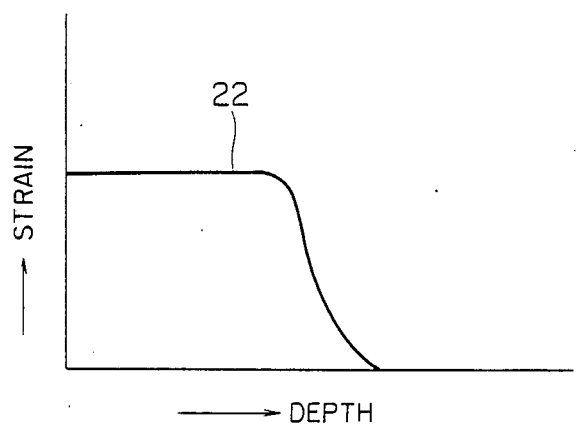
FIG. 6 is a view showing a flattened strain distribution which has been realized by a single ion-implantation and a heat treatment at a high temperature.

FIGS. 5a and 5b show X-ray diffraction curves taken of an ion-implanted layer formed by implantation of ions such as He- or Ne-ions whose projected standard deviation is small, before and after heat treatment, respectively. With only the single ion-implantation, the ion-implanted layer exhibits a complex X-ray diffraction indicated by a curve 18 shown in FIG. 5a which reflects the strain distribution (Gaussian distribution) as in the case of the ion-implanted layer realized by implantation of H-ions whose projected standard deviation is great. However, when ions such as He- and Ne-ions having a greater mass and smaller projected standard deviation ($\Delta R_p$) of not greater than 1000 Å as compared with hydrogen (H) ion of a small mass are used, there can be obtained a diffraction curve 20 of a single peak shown in FIG. 5b which represents a uniform strain distribution in the magnetic garnet film after the heat treatment at a high temperature. In other words, the strain distribution in the magnetic garnet film brought about by the single implantation of heavy ions such as He- or Ne-ions and the subsequent heat treatment at a high temperature is flat and uniform, as shown by a curve 22 in FIG. 6, which is indispensably required for the bubble drive layer or in-plane magnetization layer (ion-implanted strain layer).

It should be mentioned here that the ion species which allow the strain distribution to be flattened by the high-temperature heat treatment taught by the invention and can satisfactorily assure the ion-implantation depth required for the ion-implanted bubble device with an accelerating voltage produced by a conventional apparatus include ions of He to Kr in the periodic table.

The heat treatment may be carried out at a relatively low temperature of e.g. 200° C. or so, which however requires a lot of time for flattening the strain distribution. From the practical viewpoint of the heat treatment duration (less than 1 hour), the heat treatment should preferably be effected at a temperature in a range of 450° to 900° C.

Figure 7:
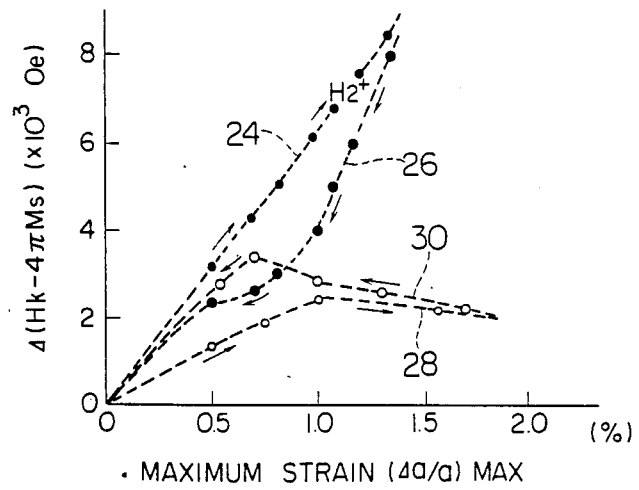
FIG. 7 is a view for graphically illustrating relationships between magnitude of strain and the effective anisotropy field change in the case where H-ions and He- or Ne-ions are heavily implanted, being followed by heat treatment.

FIG. 7 graphically shows relationships between the effective anisotropy field change and the maximum strain in the layer implanted with He- and Ne-ions, respectively, and subjected to a heat treatment at 460° C. for exemplifying the increasing in the effective anisotropy field change by the heat treatment carried out in succession to the implantation of He- and Ne-ions, respectively. In the case of the implantation of H-ions which is accompanied with uncertain or unstable factors relating to the thermal property, the effective anisotropy field change increases substantially in proportion to the magnitude of strain, as indicated by a curve 24. Subsequently, by the heat treatment taught by the invention, the strain can be reduced, as indicated by a curve 26, which is, however, accompanied with significant decreasing in the effective anisotropy field change. In contrast, in the case of the layers heavily implanted with He- and Ne-ions, respectively, the effective anisotropy field change increases as a function of the strain brought about by the ion-implantation to a certain value or level and then decreases regardless of increasing in the amount of implanted ions, as indicated by a curve 28. Under the effect of the heat treatment taught by the invention, magnitude of the strain is reduced, as indicated by a curve 30, whereas the effective anisotropy change once increases and then decreases toward the strain level of zero. It should be mentioned that the effective anisotropy field change of more than 3000 Oe is usually required for propagating properly the bubbles of ca. 1 $\mu$m in diameter along the ion-implanted propagation track. Accordingly, the high dose implantation of Ne- or He-ions which assures not only the effective anisotropy field change exceeding the above mentioned requisite minimum value by the high-temperature heat treatment in addition to the thermal stability can be considered as the very effective and advantageous measures for implementing the ion-implanted bubble propagation track.

The effective anisotropy field change required in the ion-implanted propagation track for obtaining the improved desired characteristics in the magnetic bubble device implanted with ions at a density in a range of 4 to 16 Mb/cm$^2$ is about 3500 to 4000 Oe. The strain flattened should preferably be about 0.7 to 0.9%.

In the case of the hitherto adopted hydrogen ion implantation, the strain distribution profile can be made smooth by the heat treatment at a high temperature (in a range of 450° to 900° C.). However, the strain and the effective anisotropy field change are both decreased significantly, requiring a considerably large amount of ions for the ion-implantation and thus providing a great obstacle in the practical application.

In contrast, the combination of the implantation of He- or Ne-ions and the heat treatment at the high temperature according to the teaching of the invention allows the uniform strain to be instantaneously produced with magnitude of the strain being properly decreased to ca. 0.7 to 0.9%, while the effective anisotropy field change of the layer heavily implanted with He or Ne-ions is increased to ca. 3500 Oe by the heat treatment, as will be seen in FIG. 7.

As will be appreciated from the foregoing description, the drawbacks of the prior art technique can be satisfactorily eliminated according to the teachings of the invention. More specifically, by virtue of the implantation of those ion species whose projected standard deviation ($\Delta R_p$) is small and the heat treatment at a high temperature, there can be realized an ion-implanted magnetic bubble device by a single time of ion-implantation which has an ion-implanted strain layer having an improved uniform strain distribution and exhibits an increased effective anisotropy field change.

Further, it should be noted that when a small amount of hydrogen ions is implanted for assuring a more effective anisotropy field change in succession to the implantation of Ne-ions or other and the high-temperature heat treatment taught by the invention, a magnetic bubble device which enjoys very excellent characteristics can be realized.

We claim:

1. An ion-implanted magnetic bubble device having a magnetization layer magnetized in an in-plane direction which is formed by implanting ions in a magnetic garnet film capable of holding magnetic bubbles at desired portions of the surface region thereof, wherein ions implanted for forming said magnetization layer include only those species whose projected standard deviation is not greater than 1000 Å, said ion-implantation being followed by a heat treatment at a high temperature, said ion-implantation being performed only once prior to the heat treatment and being the only ion implantation performed prior to the heat treatment.

2. An ion-implanted magnetic bubble device according to claim 1, wherein said heat treatment is effected at a temperature in a range of 450° to 900° C.

3. An ion-implanted magnetic bubble device according to claim 1, wherein ions implanted for forming said magnetization layer include those ions whose element numbers are 2 to 36.

4. An ion-implanted magnetic bubble device according to claim 1, wherein said magnetization layer is additionally implanted with hydrogen ions after said heat treatment at a high temperature for increasing effective anisotropy field change.

5. A method of manufacturing an ion-implanted magnetic bubble device having a magnetization layer, comprising the steps of:
 (a) implanting only ions whose projected standard deviation is not greater than 1000 Å in a magnetic garnet film capable of holding magnetic bubbles at desired portions of the surface region thereof; and
 (b) subsequent to said implanting, effecting heat treatment at a high temperature, said implanting being performed only once prior to the heat treatment and being the only implanting performed prior to the heat treatment.

6. A method of manufacturing an ion-implanted magnetic bubble device according to claim 5, wherein said heat treatment is effected at a temperature in a range of 450° to 900° C.

7. A method of manufacturing an ion-implanted magnetic bubble device according to claim 5, wherein hydrogen ions are implanted after said heat treatment for supplementing reduction caused by said heat treatment of effective anisotropy field change.

8. An ion-implanted magnetic bubble device according to claim 1, wherein said magnetization layer has a strain, after the heat treatment, of 0.7%–0.9%.

9. A method of manufacturing an ion-implanted magnetic bubble device according to claim 5, wherein said heat treatment is effected wherein the magnetization layer has a strain, after the heat treatment, of 0.7%–0.9%.

10. A method of manufacturing an ion-implanted magnetic bubble device according to claim 5, wherein said magnetization layer is a layer magnetized in an in-plane direction, formed by said implanting ions in said magnetic garnet film.

11. A method of manufacturing an ion-implanted magnetic bubble device having a magnetization layer magnetized in an in-plane direction which is formed by implanting ions in a magnetic garnet film capable of holding magnetic bubbles at desired portions of the surface region thereof, comprising the steps of:
 (a) implanting ions into said desired portions of the surface region of said magnetic garnet film, said ions including only species whose projected standard deviation is not greater than 1000 Å; and
 (b) subsequent to said implantation step, effecting heat treatment at a high temperature, a strain contained in said magnetization layer, after the heat treatment, being 0.7%–0.9%.

12. An ion-implanted magnetic bubble device having a magnetization layer magnetized in an in-plane direction which is formed by implanting ions in a magnetic garnet film capable of holding magnetic bubbles at desired portions of the surface region thereof, wherein ions implanted for forming said magnetization layer include only those species whose projected standard deviation is not greater than 1000 Å, said ion-implantation being followed by a heat treatment at a high temperature, with a strain contained in said magnetization layer, after said heat treatment, being 0.7%–0.9%.

* * * * *